United States Patent
Ichikawa et al.

(10) Patent No.: US 9,627,302 B2
(45) Date of Patent: Apr. 18, 2017

(54) POWER SEMICONDUCTOR DEVICE

(71) Applicant: Mitsubishi Electric Corporation, Tokyo (JP)

(72) Inventors: Keitaro Ichikawa, Tokyo (JP); Taketoshi Shikano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/021,413

(22) PCT Filed: Jan. 10, 2014

(86) PCT No.: PCT/JP2014/050319
§ 371 (c)(1),
(2) Date: Mar. 11, 2016

(87) PCT Pub. No.: WO2015/104834
PCT Pub. Date: Jul. 16, 2015

(65) Prior Publication Data
US 2016/0233151 A1 Aug. 11, 2016

(51) Int. Cl.
*H01L 23/495* (2006.01)
*H05K 7/18* (2006.01)
(Continued)

(52) U.S. Cl.
CPC .... *H01L 23/49568* (2013.01); *H01L 23/3107* (2013.01); *H01L 23/3114* (2013.01);
(Continued)

(58) Field of Classification Search
CPC .......... H01L 23/49575; H01L 23/4952; H01L 23/49562; H01L 21/56; H01L 23/36;
(Continued)

(56) References Cited

U.S. PATENT DOCUMENTS

| 5,869,883 A * | 2/1999 | Mehringer | ............ H01L 21/565 257/667 |
| 6,291,880 B1 * | 9/2001 | Ogawa | ................ H01L 23/4334 257/723 |

(Continued)

FOREIGN PATENT DOCUMENTS

| JP | H09-129820 A | 5/1997 |
| JP | 2000-49271 A | 2/2000 |

(Continued)

OTHER PUBLICATIONS

International Search Report, PCT/JP2014/050319 mailed Mar. 25, 2014.
(Continued)

*Primary Examiner* — Alonzo Chambliss
(74) *Attorney, Agent, or Firm* — Studebaker & Brackett PC

(57) ABSTRACT

An object is to provide a technique in which a cost reduction in a power semiconductor device can be achieved while maintaining heat dissipation performance as much as possible. A power semiconductor device includes a leadframe, a power semiconductor element disposed on an upper surface of the leadframe, and an insulating layer disposed on a lower surface of the leadframe. At least a partial line of a peripheral line of a region where the insulating layer is disposed, on the lower surface, is aligned, in top view, with at least a partial line of an expanded peripheral line obtained by shifting outwardly, by the amount corresponding to the thickness of the leadframe, the peripheral line of the region where the power semiconductor element is disposed, on the upper surface.

8 Claims, 7 Drawing Sheets

(51) Int. Cl.
  *H01L 21/00* (2006.01)
  *H01L 25/07* (2006.01)
  *H01L 25/18* (2006.01)
  *H01L 23/31* (2006.01)

(52) U.S. Cl.
  CPC .... *H01L 23/4952* (2013.01); *H01L 23/49503* (2013.01); *H01L 23/49531* (2013.01); *H01L 23/49537* (2013.01); *H01L 23/49562* (2013.01); *H01L 23/49575* (2013.01); *H01L 23/49582* (2013.01); *H01L 25/07* (2013.01); *H01L 25/18* (2013.01); *H01L 2224/48137* (2013.01); *H01L 2224/48139* (2013.01); *H01L 2224/48247* (2013.01); *H01L 2224/4903* (2013.01); *H01L 2224/49111* (2013.01); *H01L 2924/0002* (2013.01)

(58) Field of Classification Search
  CPC ........... H01L 23/49568; H01L 23/3107; H01L 23/3114; H01L 23/49503; H01L 23/49531; H01L 23/49537; H01L 25/07; H01L 25/18
  See application file for complete search history.

(56) References Cited

U.S. PATENT DOCUMENTS

| | | | |
|---|---|---|---|
| 6,921,971 B2 | 7/2005 | Basho et al. | |
| 7,061,080 B2* | 6/2006 | Jeun | H01L 21/565 257/666 |
| 7,800,224 B2* | 9/2010 | Lee | H01L 23/49531 257/678 |
| 9,153,514 B2* | 10/2015 | Sohn | H01L 23/3107 |
| 9,252,028 B2* | 2/2016 | Shiramizu | H01L 23/3735 |
| 9,418,910 B2 | 8/2016 | Miyamoto et al. | |
| 2006/0056213 A1* | 3/2006 | Lee | H01L 23/4334 363/144 |
| 2010/0013070 A1* | 1/2010 | Lee | H01L 23/4334 257/676 |
| 2010/0133667 A1* | 6/2010 | Oka | H01L 23/3735 257/666 |
| 2015/0035138 A1 | 2/2015 | Miyamoto et al. | |

FOREIGN PATENT DOCUMENTS

| | | |
|---|---|---|
| JP | 2001-024093 A | 1/2001 |
| JP | 2002-110872 A | 4/2002 |
| JP | 2003-168772 A | 6/2003 |
| JP | 2004-296726 A | 10/2004 |
| JP | 2009-206406 A | 9/2009 |
| JP | 2010-287699 A | 12/2010 |
| JP | 2011-009410 A | 1/2011 |
| JP | 2011-211018 A | 10/2011 |
| JP | 2013-138087 A | 7/2013 |
| JP | 2013-182964 A | 9/2013 |
| WO | 2014/006724 A1 | 1/2014 |

OTHER PUBLICATIONS

An Office Action "Notification of Reasons for Refusal," issued by the Japanese Patent Office on Aug. 30, 2016, which corresponds to Japanese Patent Application No. 2015-556691 and is related to U.S. Appl. No. 15/021,413; with English language partial translation.
Notification of Transmittal of Translation of the International Preliminary Report on Patentability and Translation of Written Opinion of the International Searching Authority; PCT/JP2014/050319 mailed Jul. 21, 2016.
An Office Action; "Notification of Reason(s) for Refusal" issued by the Japanese Patent Office on Dec. 6, 2016, which corresponds to Japanese Patent Application No. 2015-556691 and is related to U.S. Appl. No. 15/021,413; with English language translation.

* cited by examiner

POWER SEMICONDUCTOR DEVICE

TECHNICAL FIELD

The present invention relates to a power semiconductor device, and more specifically, to a power semiconductor device that includes a power semiconductor element, such as a power chip.

BACKGROUND ART

Transfer molding type power modules that include: a conductor plate (metal plate) laminated on and bonded to an insulating substrate; a power semiconductor element bonded to the conductor plate; wires that have electrical continuity with the power semiconductor element; a molded resin that covers these; and an insulating substrate (insulating layer) having a higher heat dissipation property than the molded resin have been proposed as power semiconductor devices (e.g., Patent Document 1).

PRIOR ART DOCUMENT

Patent Document

Patent Document 1: Japanese Patent Application Laid-Open No. 2009-206406

SUMMARY OF INVENTION

Problems to be Solved by the Invention

In conventional power semiconductor devices, an insulating substrate has a larger area than a conductor plate on which a power semiconductor element is mounted. As described above, with a configuration in which an insulating substrate having a higher heat dissipation property than a molded resin has a large area, the heat dissipation performance of the entire power semiconductor device (entire package) can be enhanced.

However, the cost of insulating substrates is higher than that of molded resins. For this reason, if the area of an insulating substrate increases, the cost of the entire power semiconductor device (entire package) disadvantageously rises.

Therefore, the present invention has been made in view of the above problems and an object thereof is to provide a technique in which a cost reduction in a power semiconductor device can be achieved while maintaining the heat dissipation performance as much as possible.

Means for Solving the Problems

A power semiconductor device according to the present invention includes: a leadframe; a power semiconductor element disposed on a first main surface of the leadframe; and an insulating member disposed on a second main surface, opposite to the first main surface, of the leadframe. At least a partial line of an insulating region peripheral line is aligned, in top view, with at least a partial line of an expanded peripheral line, the insulting region peripheral line being a peripheral line of a region where the insulting member is disposed, on the second main surface, the expanded peripheral line being obtained by shifting outwardly, by an amount corresponding to a thickness of the leadframe, a peripheral line of a region where the semiconductor element is disposed, on the first main surface.

Effects of the Invention

The present invention can achieve a cost reduction in a power semiconductor device while maintaining the heat dissipation performance as much as possible.

Objects, features, aspects, and advantages of the present invention will become more apparent from the following detailed description and the accompanying drawings.

DESCRIPTION OF PREFERRED EMBODIMENTS

<First Preferred Embodiment>

Figure 1:
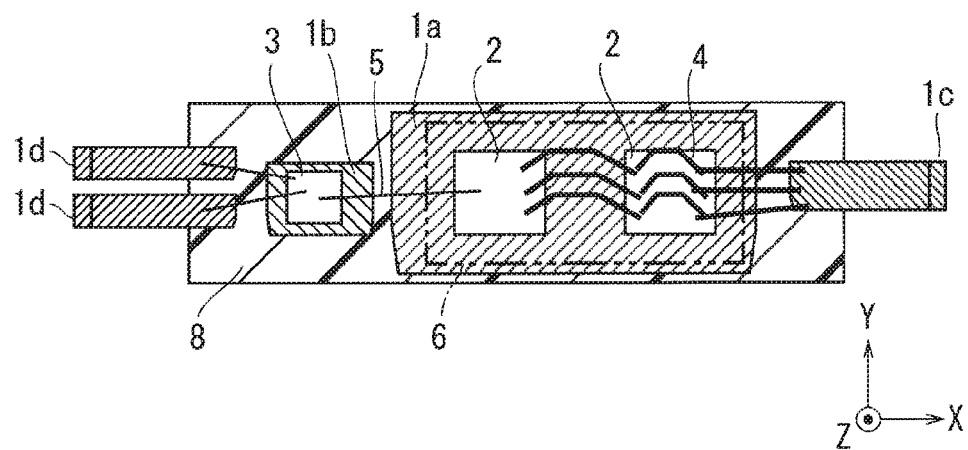
FIG. 1 is a top plan view illustrating a configuration of a power semiconductor device according to a first preferred embodiment.
Figure 2:
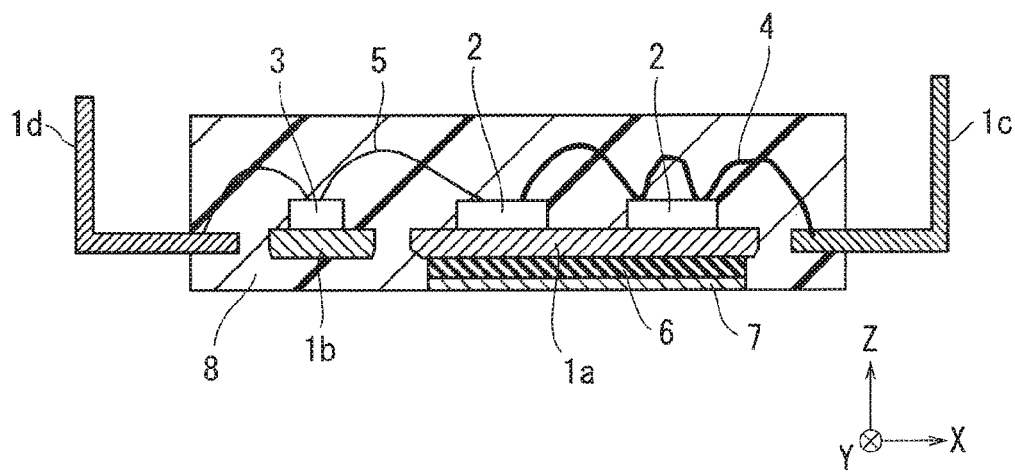
FIG. 2 is a cross sectional view illustrating the configuration of the power semiconductor device according to the first preferred embodiment.

FIG. 1 is a top plan view illustrating a configuration of a power semiconductor device according to a first preferred embodiment of the present invention; FIG. 2 is a cross sectional view illustrating the configuration along the XZ plane. This power semiconductor device includes: leadframes 1a, 1b, 1c, and 1d each made of metal (e.g., copper);

semiconductor elements for power (hereinafter referred to as "power semiconductor elements") 2 such as power chips; a semiconductor element for control (hereinafter referred to as a "control semiconductor element") 3 such as an IC (integrated circuit) chip; first wires 4; second wires 5; an insulating layer 6 that is an insulating member; a conducting plate 7; and a molded resin 8 that encapsulates these.

A detailed description will be given below of constituent elements of the power semiconductor device that employs a transfer molding type package, with reference to FIGS. 1 and 2 and the like. Note that the present invention is not limited thereto and may be a power semiconductor device that employs any transfer molding type package having another structure.

Of the leadframes 1a to 1d, the leadframes 1a and 1b are formed into a planar shape, and both the upper surfaces (+Z side surfaces) and lower surfaces (-Z side surfaces) are planarized. The leadframes 1c and 1d are formed into an L shape. Each of the leadframes 1a to 1d is formed to a thickness of 0.5 mm, for example.

The power semiconductor elements 2 are disposed on (bonded to) the upper surface (first main surface) of the leadframe 1a. In this case, two power semiconductor elements 2 are disposed on the upper surface of a die pad of the leadframe 1a.

The control semiconductor element 3 is disposed on (bonded to) the upper surface of a die pad of the leadframe 1b. This control semiconductor element 3 controls the operations of the power semiconductor elements 2 in accordance with control signals that have been input from the outside to the leadframes 1d, for example.

The first wires 4 electrically connect both the power semiconductor elements 2 and connect a power semiconductor element 2 to the leadframe 1c. Each of the first wires 4 is a thin metal wire, and for example, aluminum is used for the material of the first wires 4.

The second wires 5 electrically connect a power semiconductor element 2 to the control semiconductor element 3 and connect the control semiconductor element 3 to the leadframes 1d. Each of the second wires 5 is a metal wire that is thinner than the first wire 4, and for example, gold is used for the material of the second wires 5.

The insulating layer 6 is disposed on (bonded to) the lower surface (second main surface), opposite to the upper surface, of the leadframe 1a. In FIG. 1, the insulating layer 6 is indicated by the alternate long and two short dashes line (imaginary line). Note that the insulating layers 6 may be also indicated by alternate long and two short dashes lines in the subsequent drawings. The insulating layer 6 has a relatively high heat dissipation property, and for example, an epoxy resin containing highly conductive filler or the like is used for the material of the insulating layer 6. Note that instead of the insulating layer 6, another insulating member (e.g., insulating sheet or insulating substrate) may be provided.

The conducting plate 7 is disposed on (bonded to) the lower surface of the insulating layer 6 so as to be integrated with the insulating layer 6. The conducting plate 7 is formed into the same shape as the insulating layer 6; the insulating layer 6 and the conducting plate 7 have the same width in the X direction and the same width in the Y direction. The conducting plate 7 is used as a heatsink, and for example, metal, such as copper or aluminum, is used for the material of the conducting plate 7.

The molded resin 8 covers the leadframes 1a to 1d, the power semiconductor elements 2, the control semiconductor element 3, the first wires 4, the second wires 5, the insulating layer 6, and the conducting plate 7, except for parts of the leadframes 1c and 1d and the lower surface of the conducting plate 7. The reason why the molded resin 8 does not cover the parts of the leadframes 1c and 1d is to electrically connect the power semiconductor elements 2 and the like to the outside. The reason why the molded resin 8 does not cover the lower surface of the conducting plate 7 is to thermally connect the conducting plate 7 to a not-illustrated external radiating fin or the like. In view of the transfer molding technique, a thermally curable member, which has fluidity upon forming of the molded resin 8 (upon plastic molding) and thereafter has curability, is used for the material of the molded resin 8. Note that, in this case, the molded resin 8 is formed such that no step is created between the lower surface of the conducting plate 7 and the lower surface of the molded resin 8.

In conventional power semiconductor devices, an insulating layer has an area larger than an area of a conducting plate. Generally, the heat dissipation property of the insulating layer is higher than that of the molded resin. Therefore, by increasing the area of the insulating layer, the heat dissipation performance of the entire power semiconductor device (entire package) can be enhanced. However, the cost of insulating layers is higher than that of molded resins. For this reason, if the area of the insulating layer increases, the cost of the entire power semiconductor device (entire package) disadvantageously rises.

Therefore, in the power semiconductor device according to this first preferred embodiment, the area of the insulating layer 6 is appropriately made small such that the heat dissipation performance is maintained as much as possible, to downsize the insulating layer 6, whereby a cost reduction in the power semiconductor device can be achieved. In order to achieve this, the inventor studied the heat transfer mechanism relating to heat dissipation.

Figure 3:
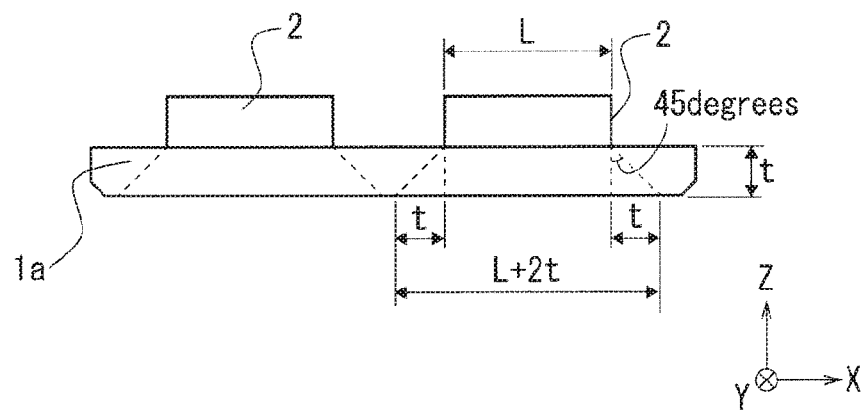
FIG. 3 is a cross sectional view illustrating the configuration of the power semiconductor device according to the first preferred embodiment.

Then, as illustrated in FIG. 3, the inventor considered that the width of the route along which heat from each power semiconductor element 2 is transferred from the upper surface to the lower surface of the leadframe 1a via its interior is widened at an angle of about 45 degrees in the direction from the upper surface to the lower surface. According to this consideration, the heat from the power semiconductor elements 2 is transferred only to expanded regions (regions L+2t in FIG. 3) on the lower surface of the leadframe 1a; each expanded region being obtained by widening outwardly, by the amount corresponding to the thickness t of the leadframe 1a, the region (the region with a width L in FIG. 3) where the power semiconductor element 2 is disposed.

Thus, this first preferred embodiment is configured such that a partial line of the peripheral line of the region where the insulating layer 6 is disposed, on the lower surface of the leadframe 1a, is aligned, in top view (FIG. 1 and FIG. 4 to be described later), with a partial line of an expanded peripheral line; the expanded peripheral line being obtained by shifting outwardly, by the amount corresponding to the thickness of the leadframe 1a, the peripheral line of the region where the power semiconductor elements 2 are disposed, on the upper surface of the leadframe 1a. Accordingly, the high-cost insulating layer 6 can be downsized while maintaining the heat dissipation performance as much as possible, thereby reducing the cost of the power semiconductor device. Note that the region where the insulating layer 6 is disposed ,on the lower surface of the leadframe 1a, may be hereinafter referred to as an "insulating layer region", and the peripheral line of the insulating layer region may be hereinafter referred to as an "insulating region peripheral line". Moreover, the region where each power semiconductor element 2 is disposed, on the upper surface of the leadframe 1*a*, may be hereinafter referred to as a "semiconductor element region".

Figure 4:
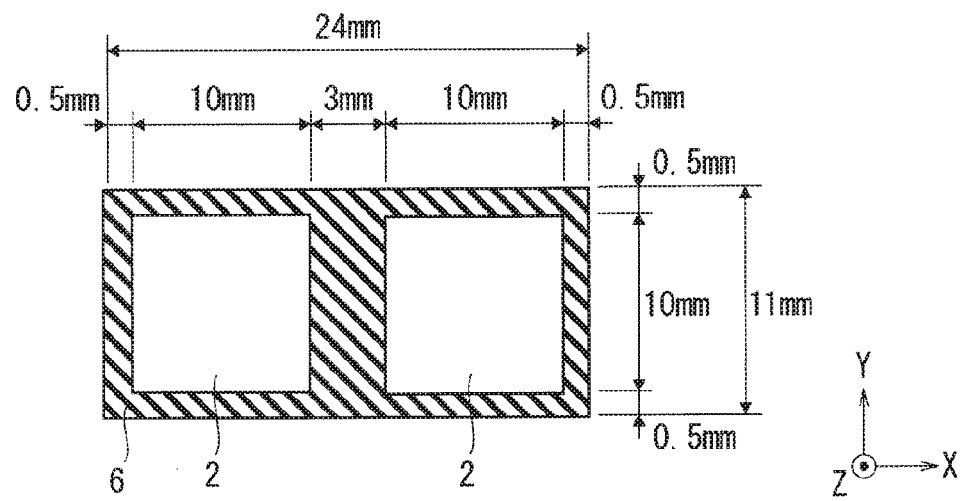
FIG. 4 is a top plan view illustrating the relationship between the power semiconductor elements and the insulating layer according to the first preferred embodiment.

FIG. 4 is a top plan view illustrating the relationship between the power semiconductor elements 2 and the insulating layer 6 according to this first preferred embodiment, namely, the relationship between the semiconductor element regions and the insulating layer region. In fact, the leadframe 1*a* is present between the power semiconductor elements 2 and the insulating layer 6, but FIG. 4 picks up and illustrates the power semiconductor elements 2 and the insulating layer 6.

A description will be given below regarding an exemplary configuration in which the semiconductor element region of each power semiconductor element 2 is 10 mm in length in both X direction and Y direction, the spacing between the semiconductor element regions of the two power semiconductor elements 2 is 3 mm, and the leadframe 1*a* is 0.5 mm in thickness.

Note that in this first preferred embodiment, a single insulating layer 6 is disposed on the lower surface of a single leadframe 1*a* while corresponding to all of a plurality of (two) power semiconductor elements 2 disposed on the single leadframe 1*a*. In other words, the insulating layer region of a single insulating layer 6 is disposed so as to bridge the semiconductor element regions of two power semiconductor elements 2. As a result, the insulating layer 6 is disposed in the spacing between the two power semiconductor elements 2.

As illustrated in FIG. 4, the −Y side line of the insulating region peripheral line is aligned with the −Y side line of an expanded peripheral line; the expanded peripheral line being obtained by shifting outwardly the peripheral lines of the two semiconductor element regions by the amount corresponding to the thickness (0.5 mm) of the leadframe 1*a*. Similarly, the +Y side line of the insulating region peripheral line is aligned with the +Y side line of an expanded peripheral line; the expanded peripheral line being obtained by shifting outwardly the peripheral lines of the two semiconductor element regions by the amount corresponding to the thickness (0.5 mm) of the leadframe 1*a*.

The −X side line of the insulating region peripheral line is aligned with the −X side line of the expanded peripheral line; the expanded peripheral line being obtained by shifting outwardly, by the amount corresponding to the thickness (0.5 mm) of the leadframe 1*a*, the peripheral line of the semiconductor element region on the −X side. Similarly, the +X side line of the insulating region peripheral line is aligned with the +X side line of the expanded peripheral line; the expanded peripheral line being obtained by shifting outwardly, by the amount corresponding to the thickness (0.5 mm) of the leadframe 1*a*, the peripheral line of the semiconductor element region on the +X side.

As described above, in this first preferred embodiment, the expanded peripheral line is obtained by shifting outwardly, by the amount corresponding to the thickness of the leadframe 1*a*, the peripheral lines of the regions where all of the plurality of (two) power semiconductor elements 2 are disposed, on the single leadframe 1*a*. Note that, for the peripheral line of the region where all of the two power semiconductor elements 2 are disposed, the peripheral line that surrounds all the semiconductor element regions of the two power semiconductor elements 2 with the minimized surrounded area may be employed, for example.

Moreover, the lines of the insulating region peripheral line other than the lines described above are positioned, in top view, outside the lines of the expanded peripheral line other than the lines described above. In other words, only some partial lines of the insulating region peripheral line are aligned, in top view, with only some partial lines of the expanded peripheral line, and the remaining lines of the insulating region peripheral line are positioned, in top view, outside the remaining lines of the expanded peripheral line.

As a result of the above, the insulating layer region of the insulating layer 6 has a rectangular shape with the length of 24 mm in the X direction and the length of 11 mm in the Y direction. Note that the configuration in FIG. 4 is an example of this first preferred embodiment. Therefore, if the size of the power semiconductor elements 2 (lengths in X direction and Y direction), the spacing between the plurality of power semiconductor elements 2, or the thickness of the leadframe 1*a* is changed, the size of the insulating layer 6 (lengths in X direction and Y direction) is also changed.

In the power semiconductor device according to this first preferred embodiment as described above, partial lines of the insulating region peripheral line are aligned, in top view, with partial lines of the expanded peripheral line obtained by shifting outwardly the peripheral lines of the semiconductor element regions by the amount corresponding to the thickness of the leadframe 1*a*. Accordingly, the high-cost insulating layer 6 can be downsized while maintaining the heat dissipation property as much as possible. In other words, it is possible to achieve the cost reduction in the power semiconductor device while maintaining the heat dissipation performance as much as possible.

<Second Preferred Embodiment>

Figure 5:
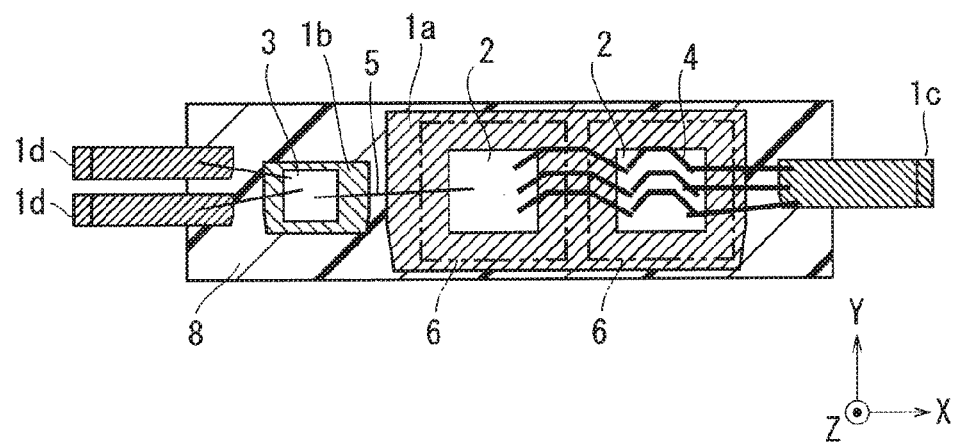
FIG. 5 is a top plan view illustrating a configuration of a power semiconductor device according to a second preferred embodiment.
Figure 6:
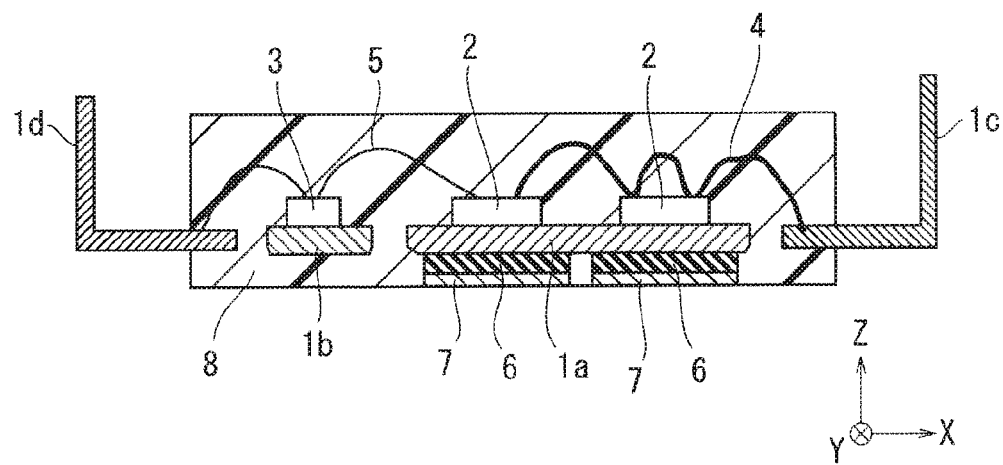
FIG. 6 is a cross sectional view illustrating the configuration of the power semiconductor device according to the second preferred embodiment.

FIG. 5 is a top plan view illustrating a configuration of a power semiconductor device according to a second preferred embodiment of the present invention; FIG. 6 is a cross sectional view illustrating the configuration along the XZ plane. Note that, in the power semiconductor device according to this second preferred embodiment, constituent elements which are the same as or similar to those described above are given the same reference symbols and the following description will be focused on different points.

As illustrated in FIGS. 5 and 6, in this second preferred embodiment, (two) insulating layers 6 that are as many as power semiconductor elements 2 are provided. More specifically, a plurality of (two) insulating layers 6, which correspond one-to-one to a plurality of (two) power semiconductor elements 2 disposed on a single leadframe 1*a*, are disposed on the lower surface of the single leadframe 1*a*.

Furthermore, the insulating region peripheral line on the −X side is substantially aligned, in top view (FIG. 5), with an expanded peripheral line obtained by shifting outwardly, by the amount corresponding to the thickness of the leadframe 1*a*, the peripheral line of the semiconductor element region on the −X side. In addition, the insulating region peripheral line on the +X side is substantially aligned with an expanded peripheral line obtained by shifting outwardly, by the amount corresponding to the thickness of the leadframe 1*a*, the peripheral line of the semiconductor element region on the +X side.

In the power semiconductor device according to this second preferred embodiment configured as above, two insulating layers 6 which correspond one-to-one to two power semiconductor elements 2 are disposed on the lower surface of a single leadframe 1*a*. Accordingly, the same effect as the first preferred embodiment can be achieved. Moreover, in addition to this, this second preferred embodiment eliminates the need to dispose an insulating layer 6 in the spacing between the two power semiconductor elements 2, unlike the first preferred embodiment in which the insulating layer 6 is also disposed in the spacing between the two power semiconductor elements 2. Consequently, it can be expected that a cost reduction in a power semiconductor device is further reliably achieved.

Figure 7:
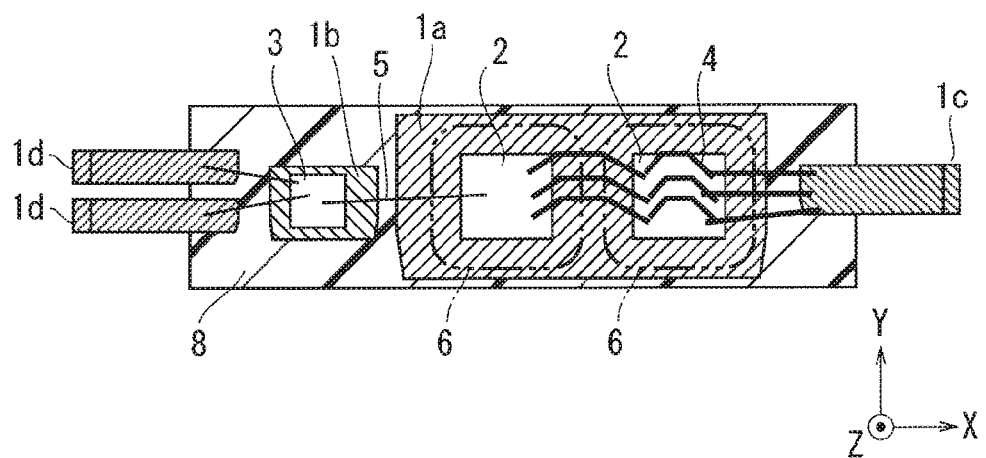
FIG. 7 is a top plan view illustrating a configuration of a power semiconductor device according to the second preferred embodiment.

Note that this second preferred embodiment is not limited to the above description. For example, each insulating region peripheral line may have rounded corners, as illustrated in FIG. 7. More specifically, the insulating region peripheral line on the −X side may be perfectly aligned, in top view (FIG. 5), with the expanded peripheral line obtained by shifting outwardly, by the amount corresponding to the thickness of the leadframe 1a, the peripheral line of the semiconductor element region on the −X side. Similarly, the insulating region peripheral line on the +X side may be perfectly aligned with the expanded peripheral line obtained by shifting outwardly, by the amount corresponding to the thickness of the leadframe 1a, the peripheral line of the semiconductor element region on the +X side.

<Third Preferred Embodiment>

Figure 8:
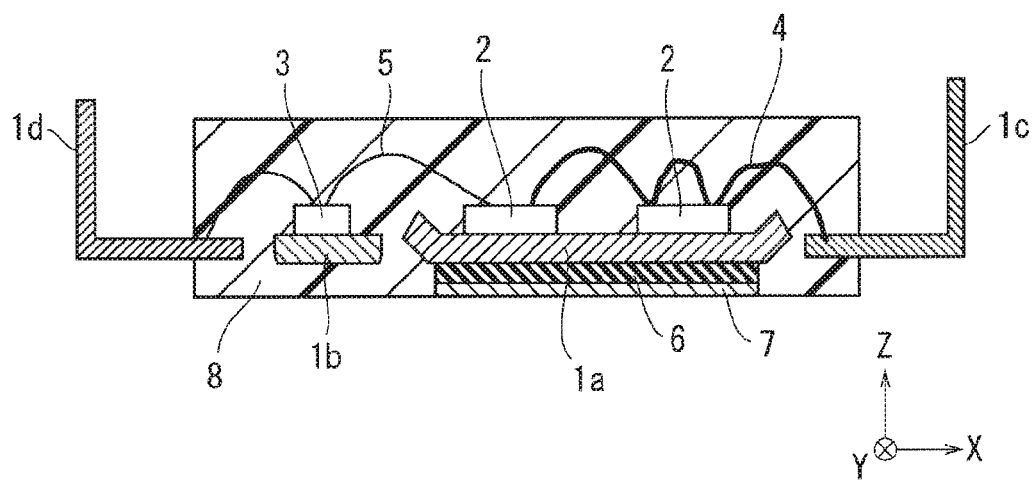
FIG. 8 is a cross sectional view illustrating a configuration of a power semiconductor device according to a third preferred embodiment.

FIG. 8 is a cross sectional view illustrating a configuration, along the XZ plane, of a power semiconductor device according to a third preferred embodiment of the present invention. Note that a top plan view illustrating the configuration of the power semiconductor device according to this third preferred embodiment is the same as the top plan views illustrating the configurations of the first and second preferred embodiments (FIGS. 1 and 5). In the power semiconductor device according to this third preferred embodiment, constituent elements which are the same as or similar to those described above are given the same reference symbols and the following description will be focused on different points.

In the power semiconductor device illustrated in FIG. 8, power semiconductor elements 2 and an insulating layer 6 are disposed inside the edges of the leadframe 1a. In addition, ends of the leadframe 1a (ends of the die pad) are bent from the insulating layer 6 side (−Z side) to the power semiconductor elements 2 side (+Z side).

The power semiconductor device according to this third preferred embodiment as described above can achieve the same effect as the first preferred embodiment.

Moreover, in addition to this, it is possible to provide a design in consideration of the fluidity of a resin forming a molded resin 8. Consequently, when the molded resin 8 of the power semiconductor device is formed, for example, the fluidity of the resin can be increased in the space adjacent to the lower surface of the leadframe 1a and to the sides of the insulating layer 6 and a conducting plate 7.

<Fourth Preferred Embodiment>

Figure 9:
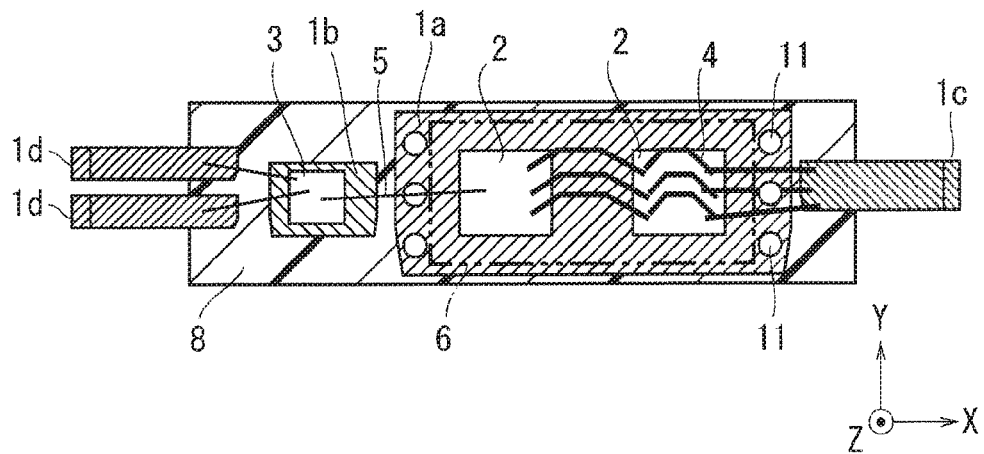
FIG. 9 is a top plan view illustrating a configuration of a power semiconductor device according to a fourth preferred embodiment.
Figure 10:
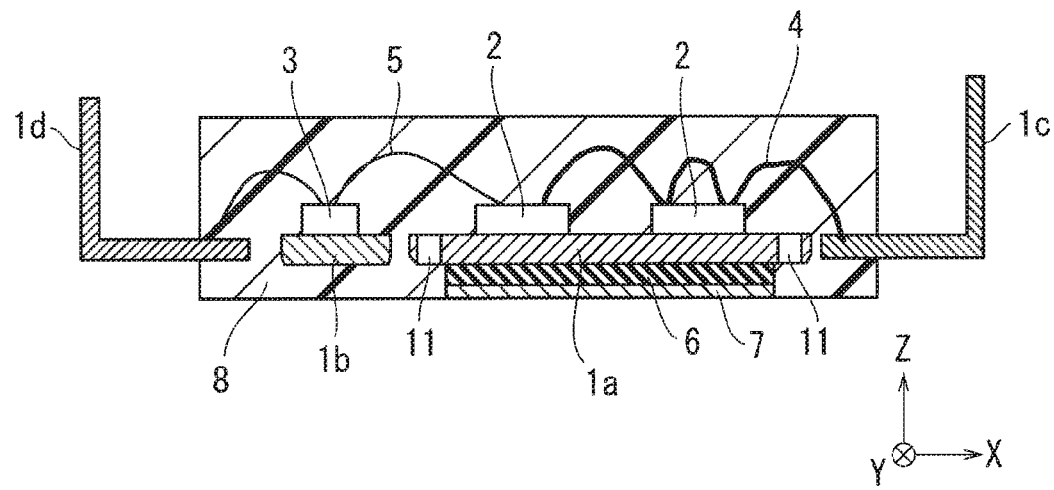
FIG. 10 is a cross sectional view illustrating the configuration of the power semiconductor device according to the fourth preferred embodiment.

FIG. 9 is a top plan view illustrating a configuration of a power semiconductor device according to a fourth preferred embodiment of the present invention; FIG. 10 is a cross sectional view illustrating the configuration along the XZ plane. Note that, in the power semiconductor device according to this fourth preferred embodiment, constituent elements which are the same as or similar to those described above are given the same reference symbols and the following description will be focused on different points.

As illustrated in FIGS. 9 and 10, in this fourth preferred embodiment, through-holes 11 that pass through the upper surface at locations where power semiconductor elements 2 are not disposed and through the lower surface at locations where an insulating layer 6 is not disposed are provided in the leadframe 1a. In this case, six through-holes 11 are provided in the leadframe 1a; however, the number of through-holes 11 is not limited thereto.

The power semiconductor device according to this fourth preferred embodiment as described above can achieve the same effect as the first preferred embodiment. Moreover, in addition to this, it is possible to provide a design in consideration of the fluidity of a resin forming a molded resin 8. Consequently, when the molded resin 8 of the power semiconductor device is formed, for example, the fluidity of the resin can be increased in the space adjacent to the lower surface of the leadframe 1a and to the sides of the insulating layer 6 and a conducting plate 7.

Note that if it is desirable to further increase the fluidity of the resin forming the molded resin 8, the configurations of this fourth preferred embodiment and the above-described third preferred embodiment may be combined.

<Fifth Preferred Embodiment>

Figure 11:
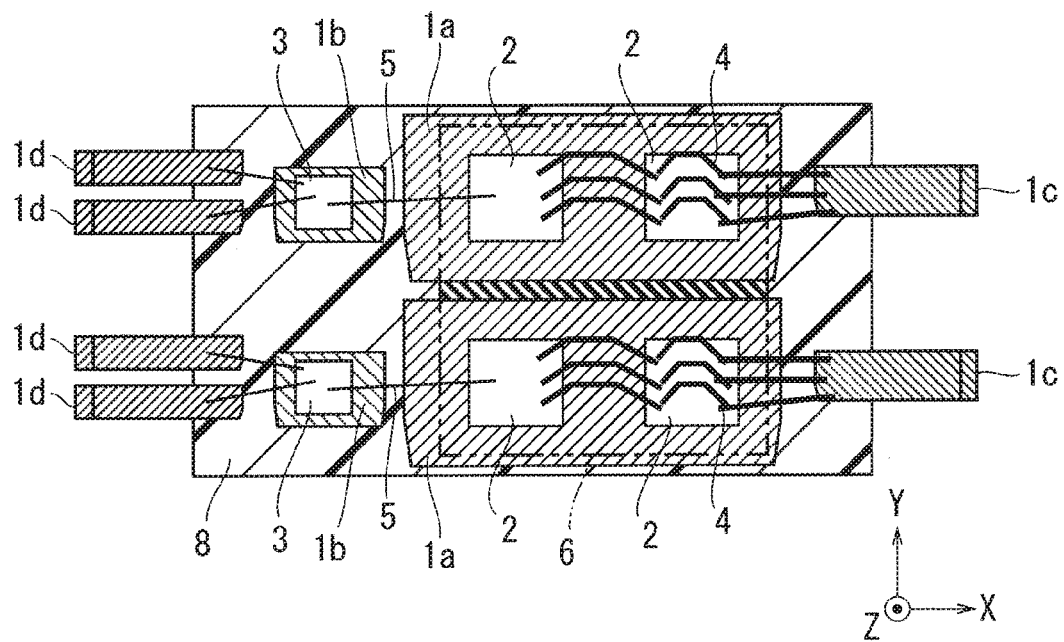
FIG. 11 is a top plan view illustrating a configuration of a power semiconductor device according to a fifth preferred embodiment.

FIG. 11 is a top plan view illustrating a configuration of a power semiconductor device according to a fifth preferred embodiment of the present invention. In the power semiconductor device according to this fifth preferred embodiment, constituent elements which are the same as or similar to those described above are given the same reference symbols and the following description will be focused on different points.

As illustrated in FIG. 11, in this fifth preferred embodiment, a plurality of (two) leadframes 1a are arrayed in the Y direction, and power semiconductor elements 2 in a plurality of (two) row units are disposed on the plurality of (two) leadframes 1a. More specifically, two power semiconductor elements 2 that are adjacent to each other in the X direction are disposed on each leadframe 1a as power semiconductor elements 2 in one row unit. Note that the power semiconductor elements 2 in each row unit employ a similar configuration as that described in the first preferred embodiment. This means that the cross sectional view of the power semiconductor devices according to this fifth preferred embodiment along each row unit is similar to the cross sectional view illustrating the configuration of the first preferred embodiment (FIG. 1).

However, in this fifth preferred embodiment, a plurality of insulating layers 6 are not disposed but a single insulating layer 6 is disposed. More specifically, the single insulating layer 6 is disposed on the lower surfaces of the plurality of (two) leadframes 1a while corresponding to all of the power semiconductor elements 2 in the plurality of (two) row units. Thus, the insulating layer region of the single insulating layer 6 is disposed so as to bridge the semiconductor element regions of the four power semiconductor elements 2.

Furthermore, in this fifth preferred embodiment, the line of the insulating region peripheral line on the −Y side is aligned, in top view (FIG. 11), with the line of an expanded peripheral line on the −Y side; the expanded peripheral line being obtained by shifting outwardly, by the amount corresponding to the thickness of the leadframes 1a, the peripheral lines of the two semiconductor element regions on the −Y side. In addition, the line of the insulating region peripheral line on the +Y side is aligned with the line of an expanded peripheral line on the +Y side; the expanded peripheral line being obtained by shifting outwardly, by the amount corresponding to the thickness of the leadframes 1a, the peripheral lines of the two semiconductor element regions on the +Y side.

Furthermore, the line of the insulating region peripheral line on the −X side is aligned, in top view (FIG. 11), with the line of an expanded peripheral line on the −X side; the expanded peripheral line being obtained by shifting outwardly, by the amount corresponding to the thickness of the leadframes 1a, the peripheral lines of the two semiconductor element regions on the −X side. In addition, the line of the insulating region peripheral line on the +X side is aligned with the line of an expanded peripheral line on the +X side; the expanded peripheral line being obtained by shifting outwardly, by the amount corresponding to the thickness of the leadframes 1a, the peripheral lines of the two semiconductor element regions on the +X side.

As described above, in this fifth preferred embodiment, an expanded peripheral line is obtained by shifting outwardly, by the amount corresponding to the thickness of the leadframes 1a, the peripheral line of the region where all power semiconductor elements 2 in a plurality of (two) row units are disposed, on the upper surfaces of a plurality of (two) leadframes 1a.

The power semiconductor device according to this fifth preferred embodiment configured as above can achieve the same effect as the first preferred embodiment, even in the configuration in which power semiconductor elements 2 are arrayed in a plurality of rows.

Figure 12:
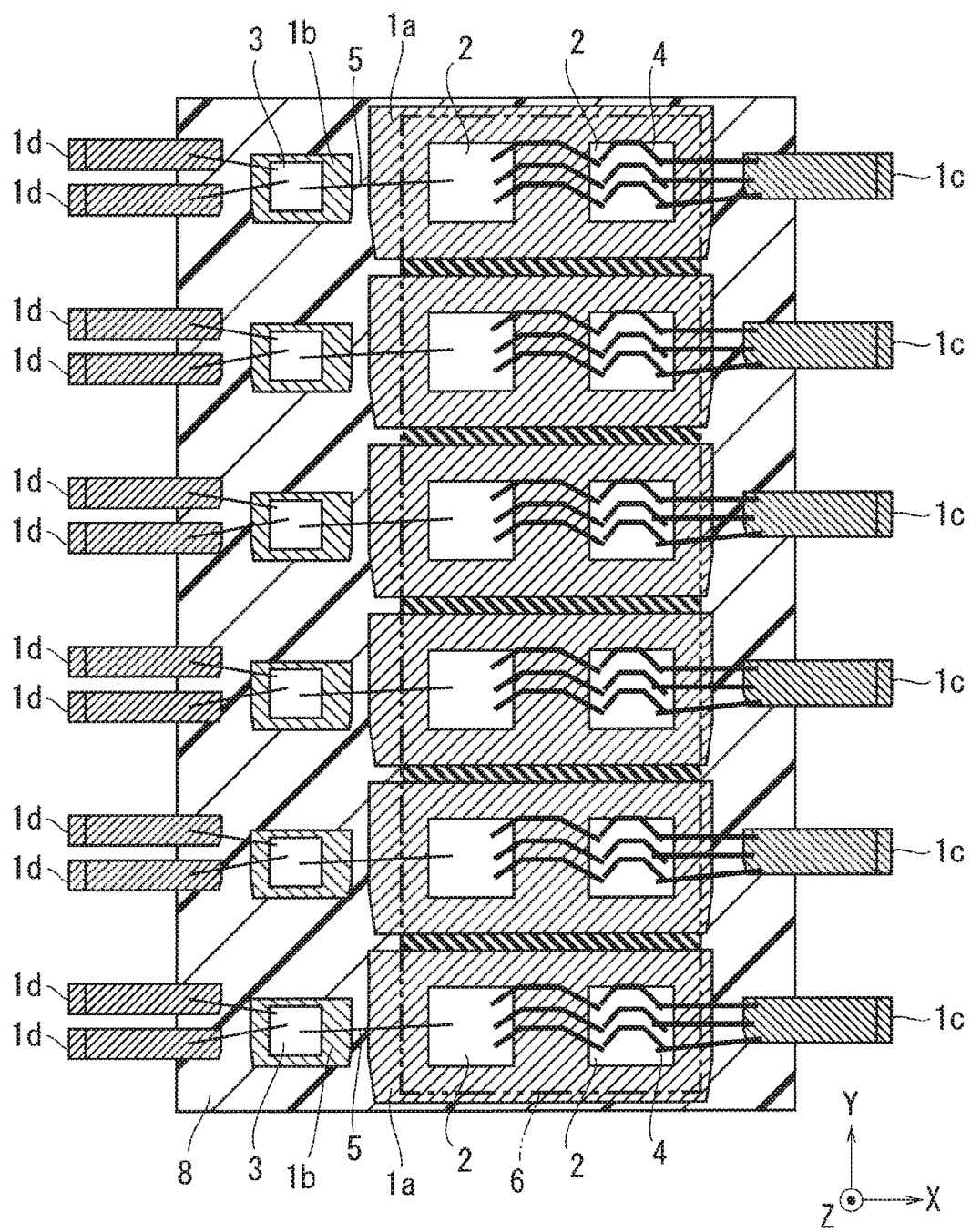
FIG. 12 is a top plan view illustrating a configuration of a power semiconductor device according to the fifth preferred embodiment.

Note that the number of row units of the power semiconductor elements 2 is not limited to two. For example, as illustrated in FIG. 12, the number of row units of the power semiconductor elements 2 may be any natural number, such as six, three to five, or seven or more. In addition, although not illustrated, at least one of the third preferred embodiment and the fourth preferred embodiment may be applied to this fifth preferred embodiment.

<Sixth Preferred Embodiment>

Figure 13:
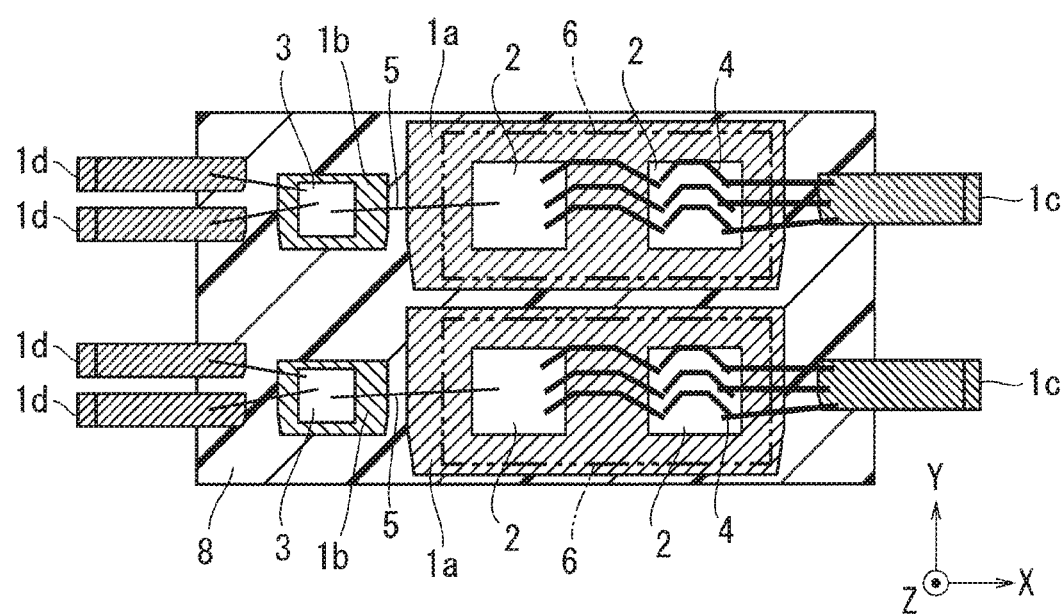
FIG. 13 is a top plan view illustrating a configuration of a power semiconductor device according to a sixth preferred embodiment.

FIG. 13 is a top plan view illustrating a configuration of a power semiconductor device according to a sixth preferred embodiment of the present invention. In the power semiconductor device according to this sixth preferred embodiment, constituent elements which are the same as or similar to those described above are given the same reference symbols and the following description will be focused on different points.

As illustrated in FIG. 13, in this sixth preferred embodiment, similarly to the fifth preferred embodiment, a plurality of (two) leadframes 1a are arrayed in the Y direction, and power semiconductor elements 2 in a plurality of (two) row units are disposed on the plurality of (two) leadframes 1a.

However, in this sixth preferred embodiment, a single insulating layer 6 is not disposed, but a plurality of (two) insulating layers 6 are disposed on the lower surfaces of the two leadframes 1a while corresponding one-to-one to the power semiconductor elements 2 in the plurality of (two) row units described above. Thus, the insulating layer region of each insulating layer 6 is disposed so as to bridge the semiconductor element regions of the power semiconductor elements 2 in a corresponding row unit.

Furthermore, in this sixth preferred embodiment, the −Y side lines of the insulating region peripheral lines in the respective rows are aligned, in top view (FIG. 13), with the −Y side lines of expanded peripheral lines; each expanded peripheral line being obtained by shifting outwardly, by the amount corresponding to the thickness of the leadframes 1a, the peripheral lines of the semiconductor element regions in a corresponding row. Similarly, the +Y side lines of the insulating region peripheral lines in the respective rows are aligned with the +Y side lines of expanded peripheral lines; each expanded peripheral line being obtained by shifting outwardly, by the amount corresponding to the thickness of the leadframes 1a, the peripheral lines of the semiconductor element regions in a corresponding row.

Furthermore, the −X side lines of the insulating region peripheral lines in the respective rows are aligned with the −X side lines of corresponding expanded peripheral lines; each expanded peripheral line being obtained by shifting outwardly, by the amount corresponding to the thickness of the leadframes 1a, the peripheral line of the semiconductor element region on the −X side in a corresponding row. Similarly, the +X side lines of the insulating region peripheral lines in the respective rows are aligned with the +X side lines of corresponding expanded peripheral lines; each expanded peripheral line being obtained by shifting outwardly, by the amount corresponding to the thickness of the leadframes 1a, the peripheral line of the semiconductor element region on the +X side in a corresponding row.

As described above, in this sixth preferred embodiment, expanded peripheral lines are obtained by shifting outwardly, by the amount corresponding to the thickness of the leadframes 1a, the peripheral lines of the regions where power semiconductor elements 2 in respective row units are disposed, on the upper surfaces of the leadframes 1a.

The power semiconductor device according to this sixth preferred embodiment configured as above can achieve the same effect as the fifth preferred embodiment. Moreover, in addition to this, although the insulating layer 6 is disposed in the spacing between the power semiconductor elements 2 disposed in two rows and adjacent to each other in the fifth preferred embodiment, this sixth preferred embodiment eliminates the need to dispose the insulating layer 6 in the spacing. Consequently, it can be expected that a cost reduction in a power semiconductor device is further reliably achieved.

Figure 14:
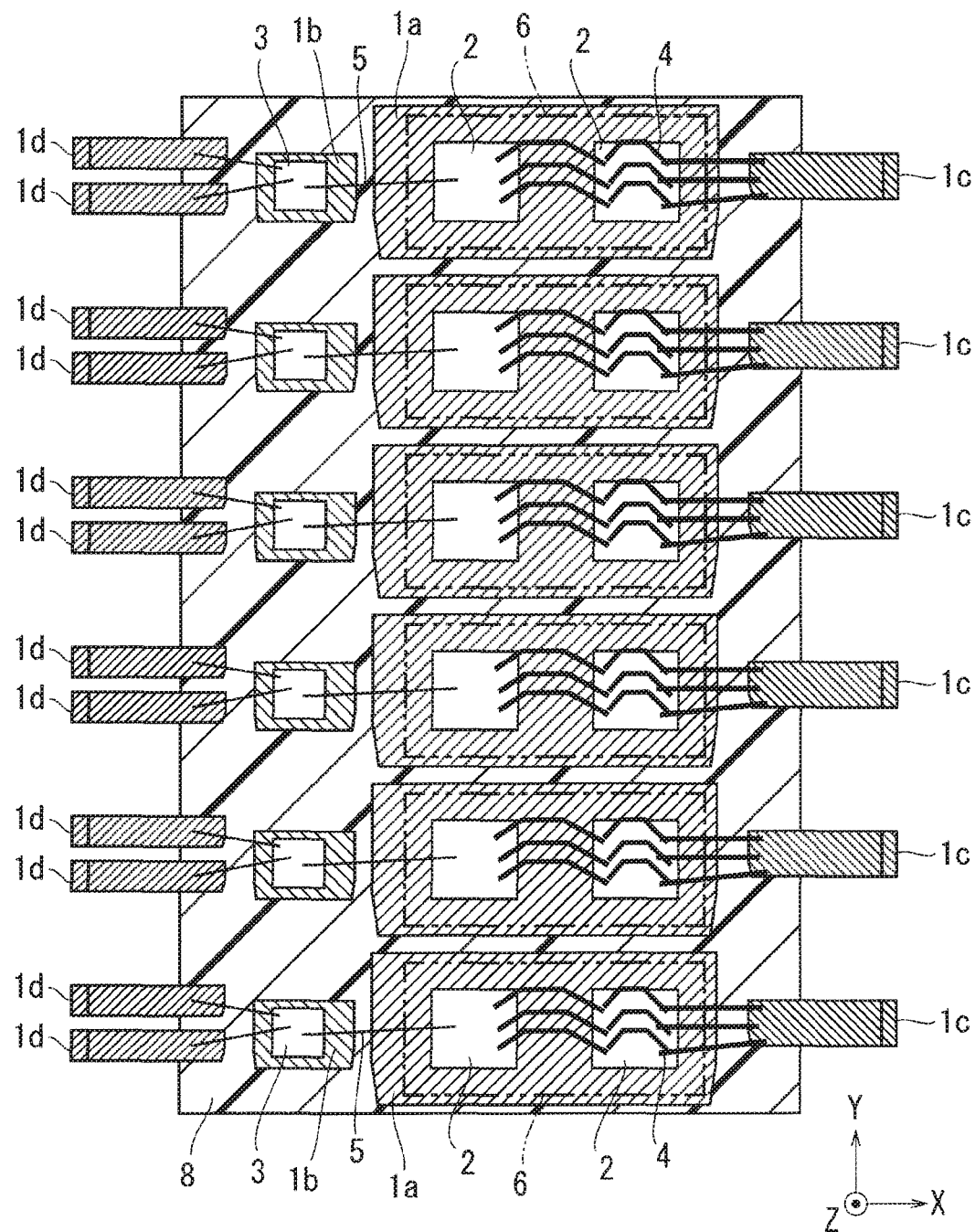
FIG. 14 is a top plan view illustrating a configuration of a power semiconductor device according to the sixth preferred embodiment.

Note that the number of row units of the power semiconductor elements 2 is not limited to two. For example, as illustrated in FIG. 14, the number of row units of the power semiconductor elements 2 may be any natural number, such as six, three to five, or seven or more. In addition, although not illustrated, at least one of the third preferred embodiment and the fourth preferred embodiment may be applied to this sixth preferred embodiment.

Note that, in the present invention, the preferred embodiments can be freely combined, or the preferred embodiments can be arbitrarily modified or omitted as appropriate within the scope of the present invention.

Although the present invention has been described in detail, the above description is exemplary in all aspects, and the present invention is not limited thereto. It is appreciated that a large number of modifications that have not been exemplified can be conceived of without departing from the scope of the present invention.

REFERENCE SIGN LIST

1a: leadframe
2: power semiconductor element
6: insulating layer
11: through-hole

The invention claimed is:

1. A power semiconductor device comprising:
a leadframe;
a power semiconductor element disposed on a first main surface of said leadframe; and
an insulating member disposed on a second main surface, opposite to said first main surface, of said leadframe, wherein at least an edge of said insulating member is aligned, in top view, with at least a partial line of an expanded peripheral line, said expanded peripheral line being obtained by shifting outwardly, by an amount corresponding to a thickness of said leadframe, a peripheral line of a region where said semiconductor element is disposed, on said first main surface.

2. The power semiconductor device according to claim 1, wherein
another edge of said insulating member is positioned, in top view, outside a remaining line of said expanded peripheral line.

3. The power semiconductor device according to claim 1, wherein
said one insulating member is disposed on said second main surface of said one leadframe while corresponding to all of a plurality of said semiconductor elements disposed on said one leadframe, and
said expanded peripheral line is obtained by shifting outwardly, by the amount corresponding to the thickness of said leadframe, a peripheral line of a region where all of said plurality of semiconductor elements are disposed, on said first main surface.

4. The power semiconductor device according to claim 1, wherein
a plurality of said insulating members are disposed on said second main surface of said one leadframe while corresponding one-to-one to a plurality of said semiconductor elements disposed on said one leadframe.

5. The power semiconductor device according to claim 1, wherein
said one insulating member is disposed on said second main surfaces of a plurality of said leadframes while corresponding to all of a plurality of said semiconductor elements in row units disposed on said plurality of leadframes, and
said expanded peripheral line is obtained by shifting outwardly, by the amount corresponding to the thickness of said leadframes, a peripheral line of a region where all of said plurality of semiconductor elements in the row units are disposed, on said first main surfaces of said plurality of leadframes.

6. The power semiconductor device according to claim 1, wherein
a plurality of said insulating members are disposed on said second main surfaces of a plurality of said leadframes while corresponding one-to-one to a plurality of said semiconductor elements in row units disposed on said plurality of leadframes, and
said expanded peripheral line is obtained by shifting outwardly, by the amount corresponding to the thickness of said leadframes, a peripheral line of a region where said semiconductor elements in a corresponding row unit are disposed, on said first main surface of each of said leadframes.

7. The power semiconductor device according to claim 1, wherein
an end of said leadframe is bent from a side of said insulating member to a side of said semiconductor element.

8. The power semiconductor device according to claim 1, wherein
a through-hole that passes through said first main surface at a location where said semiconductor element is not disposed and through said second main surface at a location where said insulating member is not disposed is provided in said leadframe.

* * * * *